(12) United States Patent
Schlitzkus et al.

(10) Patent No.: US 9,638,599 B2
(45) Date of Patent: May 2, 2017

(54) CIRCUIT CARRIER FOR A SENSOR UNIT AND CORRESPONDING SENSOR UNIT

(71) Applicant: Robert Bosch GmbH, Stuttgart, DE (US)

(72) Inventors: Michael Schlitzkus, Dietmannsried (DE); Stefan Lehenberger, Weitnau (DE); Dmitriy Aranovich, Pliezhausen (DE); Robert Hengler, Durach (DE); Christian Pfleger, Reutlingen (DE); Philip Martin Lenk, Burgberg (DE); Peter Diesel, Bad Hindelang (DE)

(73) Assignee: Robert Bosch GmbH, Stuttgart (DE)

( * ) Notice: Subject to any disclaimer, the term of this patent is extended or adjusted under 35 U.S.C. 154(b) by 110 days.

(21) Appl. No.: 14/388,492

(22) PCT Filed: Feb. 13, 2013

(86) PCT No.: PCT/EP2013/052844
§ 371 (c)(1),
(2) Date: Sep. 26, 2014

(87) PCT Pub. No.: WO2013/143758
PCT Pub. Date: Oct. 3, 2013

(65) Prior Publication Data
US 2015/0040676 A1    Feb. 12, 2015

(30) Foreign Application Priority Data
Mar. 27, 2012   (DE) .................. 10 2012 204 905

(51) Int. Cl.
*G01L 19/14*    (2006.01)
*G01L 19/00*    (2006.01)
(Continued)

(52) U.S. Cl.
CPC ...... *G01L 19/0069* (2013.01); *G01L 19/0038* (2013.01); *G01L 19/143* (2013.01);
(Continued)

(58) Field of Classification Search
CPC ............. G01L 19/0069; G01L 19/0076; G01L 19/0084; G01L 19/147; G01L 19/148
See application file for complete search history.

(56) References Cited

U.S. PATENT DOCUMENTS 5,587,535 A * 12/1996 Sasaki ..................... G01L 19/14
338/4
2013/0255391 A1* 10/2013 Schlitzkus ............ G01L 19/148
73/753

FOREIGN PATENT DOCUMENTS

DE    10 2010 041 169 A1    3/2012
WO    2009/007286 A2        1/2009
WO    2011/047919 A1        4/2011

OTHER PUBLICATIONS

International Search Report corresponding to PCT Application No. PCT/EP2013/052844, mailed Jun. 5, 2013 (German and English language document) (5 pages).

\* cited by examiner

*Primary Examiner* — Justin Olamit
(74) *Attorney, Agent, or Firm* — Maginto, Moore & Beck LLP (57) ABSTRACT

A circuit carrier for a sensor unit comprises a first interface via which at least one electrical output signal is tapped at least at one connection point of a measuring cell, a second interface via which the at least one electrical output signal of the measuring cell is applied via at least one first contact element to a circuit board with an electronic circuit, and a hollow, cylindrical main body. The main body includes an inner joining geometry defined on an inner contour which
(Continued)

defines at least in part the first interface, an outer joining geometry which defines at least in part the second interface, and configured to electrically connect to a connection point of the measuring cell in a force-free manner. The outer joining geometry is configured as a receiving pocket with a protruding collar, and includes the at least one first contact element.

11 Claims, 6 Drawing Sheets

(51) Int. Cl.
    *H05K 1/02*     (2006.01)
    *H05K 5/00*     (2006.01)
(52) U.S. Cl.
    CPC .......... *G01L 19/147* (2013.01); *G01L 19/148* (2013.01); *H05K 1/02* (2013.01); *H05K 5/0091* (2013.01); *H05K 2201/10151* (2013.01)

CIRCUIT CARRIER FOR A SENSOR UNIT AND CORRESPONDING SENSOR UNIT

This application is a 35 U.S.C. §371 National Stage Application of PCT/EP2013/052844, filed on Feb. 13, 2013, which claims the benefit of priority to Serial No. DE 10 2012 204 905.3, filed on Mar. 27, 2012 in Germany, the disclosures of which are incorporated herein by reference in their entirety.

The disclosure relates to a circuit carrier for a sensor unit and a corresponding sensor unit.

BACKGROUND

By way of example, a connection unit for a pressure measuring cell is known from WO 2009/007286 A2. The known connection unit comprises a protective sleeve, in which at least one measuring cell, which in particular measures a pressure of a hydraulic block, and a circuit carrier with a vertically disposed circuit board are arranged, which connection unit comprises an electronic circuit with at least one electronic and/or electrical component part. The circuit carrier has a lower cylindrical region and an upper cylindrical region, which are interconnected via a rectangular middle portion, wherein the vertically disposed circuit board is arranged parallel to the rectangular middle portion between the two cylindrical portions of the circuit carrier. The pressure measuring cell has at least one connection point, via which at least one electrical output signal of the pressure measuring cell can be tapped. The circuit carrier has an internal interface, which taps the at least one electrical output signal of the pressure measuring cell and applies this to the electronic circuit, and one external interface, via which an output signal of the electronic circuit can be tapped. Here, the internal interface is formed at a first end of the protective sleeve, and the external interface is formed at a second end of the protective sleeve. Furthermore, the circuit carrier has at least one external conductor track for contacting the connection point to the electronic circuit. In addition, at least one contact means is provided, via which an output signal of the electronic circuit can be tapped, wherein the electronic circuit is connected to the contact means via at least one external conductor track of the circuit carrier. The contact between the pressure measuring cell and the circuit carrier or between the circuit carrier and the circuit board or the electronic components is established via corresponding conductive adhesive connections. To produce these conductive adhesive connections, the circuit carrier has conductive adhesive domes and the pressure measuring cell or the circuit board or the electronic components have corresponding conductive adhesive surfaces respectively. The circuit carrier preferably consists at least of a plastic preliminary injection-molded article composed of galvanizable plastic and a second, non-galvanizable plastic, wherein the conductor tracks and the conductive adhesive domes are produced in a galvanic process as a metallic surface coating on the galvanized plastic. To detachably directly contact the connection unit and a built-on control device, the corresponding contact means are preferably formed as contact rivets, which are bonded by means of conductive adhesive into provided openings connected to the conductor tracks.

SUMMARY

By contrast, the circuit carrier according to the disclosure for a sensor unit has the advantage that the circuit carrier combines the functionality of a contact piece and of a circuit board carrier and electrically connects the circuit board to a measuring cell, which converts a measured value into electrical output signals. The connection points of the measuring cell are contacted practically in a force-free manner, preferably using bonding technology, to the second contact means of the circuit carrier. Embodiments of the circuit carrier according to the disclosure thus form the connection element between a sensor carrier with measuring cell and the circuit board. The circuit carrier can be mechanically connected, at the first interface, to the sensor carrier by being pressed in, plugged on and/or adhesively bonded, wherein the circuit carrier is arranged at a distance from the measuring cell in order to advantageously avoid subjecting the measuring cell to a force effect during the assembly of the circuit carrier, which may negatively influence the measurement result in a lasting manner. The circuit board can be mechanically and electrically connected to the circuit carrier directly at the second interface by means of conductive adhesive bonding, contact springs, etc.

Embodiments of the circuit carrier according to the disclosure enable an optimization of the installation space of the sensor unit by arranging the circuit board substantially vertically or, by changing the joining geometry, at any arbitrary angle of the circuit board. The circuit board can thus be adapted in a versatile manner to the circuit carrier and inserted directly into the circuit carrier, wherein the position or the angle of the circuit board can be made versatile as a result of the guidance in the circuit carrier. In addition, embodiments of the circuit carrier according to the disclosure advantageously reduce the number of contact junctions between measuring cell and circuit board, thus increasing the reliability of the sensor unit, since any contact junction can fail.

Embodiments of the present disclosure provide a circuit carrier for a sensor unit having a first interface, via which at least one electrical output signal can be tapped at least at one connection point of a measuring cell, and a second interface, via which the at least one electrical output signal of the measuring cell can be applied via first contact means to a circuit board with an electronic circuit. In accordance with the disclosure, the circuit carrier comprises a main body having an inner joining geometry, which is a mechanical part of the first interface, and an outer joining geometry, which is a mechanical part of the second interface, wherein the main body has at least one second contact means, which can be electrically connected in a force-free manner to a corresponding connection point of the measuring cell.

By contrast, the sensor unit according to the disclosure has the advantage that it can be constructed in a particularly compact manner, since the circuit carrier forms only the internal interface and is arranged at the first end of the protective sleeve. The circuit board is formed within the protective sleeve simultaneously as a structural component part and is joined to the circuit carrier at the first end face. At the second end face, the circuit board is joined to a support unit, which supports the circuit board against the protective sleeve. The overall height of the sensor unit can thus be reduced advantageously.

Embodiments of the sensor unit according to the disclosure have a modular structure, such that a wide range of different sensors and client interfaces can be implemented advantageously. Furthermore, due to the protective sleeve in conjunction with the support unit and the circuit carrier, an integrated contact protection can be provided, which reduces the likelihood of failure during the assembly or in the field. In addition, redundant contacting possibilities can be provided advantageously for the external interface directly on the circuit board without effective external static contacting force.

A sensor unit according to the disclosure has an intelligent combination of different previously discrete structural elements and/or functions in one component part. Such combined component parts have more degrees of freedom and can thus be used in a more versatile manner. Due to the use of a plurality of such combined component parts with multiple functions, a sensor unit is produced from a modular composite, which comprises the circuit carrier, which electrically contacts the measuring cell, the vertically disposed circuit board, which can preferably be fitted with components on either side and is plugged and/or bonded into the circuit carrier, the support element, which is preferably plugged and/or bonded onto the vertically disposed circuit board, and the protective sleeve having a flange, which carries the measuring cell. An electronic circuit is arranged on the circuit board and for example performs a signal amplification and/or a processing of a raw signal of the measuring cell. In addition, with the use of an application-specific integrated circuit (ASIC), a corresponding protective circuit can be provided on the circuit board. As an additional function, guide means for guiding external contact means can be provided in the support element, which means form the external interface with the second contact means of the circuit board.

Embodiments of the present disclosure provide a sensor unit which has a protective sleeve, in which at least one measuring cell, which in particular measures a pressure of a hydraulic block, and a circuit carrier with a substantially vertically disposed circuit board are arranged, which can preferably be fitted with components on either side and comprises an electronic circuit having at least one electronic and/or electrical component part. The measuring cell has at least one connection point, via which at least one electrical output signal of the measuring cell can be tapped. The circuit carrier has an internal interface, which taps the at least one electrical output signal of the measuring cell and applies this to the electronic circuit. An output signal of the electronic circuit can be tapped via an external interface. Here, the internal interface is formed at a first end of the protective sleeve and the external interface is formed at a second end of the protective sleeve. In accordance with the disclosure, the sensor unit comprises the above-described circuit carrier, of which the main body comprises an inner joining geometry, which is a mechanical part of the first interface, and an outer joining geometry, which is a mechanical part of the second interface, wherein the main body has at least one second contact means, which is electrically connected in a force-free manner to a corresponding connection point of the measuring cell.

Due to the measures and developments discussed in the dependent claims, advantageous improvements of the circuit carrier for a sensor unit and of the sensor unit are possible.

It is particularly advantageous that the inner joining geometry of the circuit carrier is matched to an outer contour of the measuring cell. The main body of the circuit carrier can thus surround the measuring cell with play in the joined state, such that, with assembly, no force from the circuit carrier can act on the measuring cell. The circuit carrier preferably consists at least of a plastic preliminary injection-molded article composed of a galvanizable first plastic and a non-galvanizable second plastic, wherein conductor tracks and contact means can be applied as a metallic surface coating to the galvanizable plastic by means of a galvanic process. Alternatively, the plastic preliminary injection-molded article can be fabricated from the non-galvanizable second plastic and can be overmolded at least in part with the galvanizable first plastic.

By way of example, the circuit carrier can be produced by means of MID 2C technology, that is to say the injection-molded circuit carrier (molded interconnected device) consists of two components comprising a galvanizable first plastic, which is overmolded at least in part with a non-galvanizable second plastic. Alternatively, the non-galvanizable second plastic can also be overmolded at least in part with the galvanizable first plastic. The partly protruding surfaces of the preliminary injection-molded article are coated by means of a galvanic process with a metallic surface, such that the external conductor tracks and contact means are produced. The use of such an injection-molded MID circuit carrier is particularly well suited in the present case of application, since the miniaturization of the connection unit for the sensor unit can be improved due to the improved freedom of design and the integration of electrical and mechanical functions. The circuit carrier can also be produced selectively by an MID which is directly structured by means of a laser. The MID circuit carrier then consists of an injection-molded part, in which the locations of the conductor tracks and contact means are structured with the aid of a laser and are then coated by means of a galvanic process with a metallic surface. Alternatively, the circuit carrier can also be produced as a lead frame overmolded with plastic.

In an advantageous embodiment of the circuit carrier according to the disclosure, the at least one first contact means can be electrically connected via a conductor track formed externally on the main body to at least one corresponding second contact means. The at least one second contact means of the circuit carrier can preferably be electrically connected via a bonding wire to the corresponding connection point of the measuring cell.

In a further advantageous embodiment of the circuit carrier according to the disclosure, the main body can be formed as a hollow cylinder, on the inner contour of which the inner joining geometry can be formed, preferably as a polygon. The outer joining geometry on the main body of the circuit carrier may comprise two receiving pockets with protruding collars, which may each comprise at least one first contact means for electrically contacting the circuit board.

In a further advantageous embodiment of the circuit carrier according to the disclosure, means for joining the circuit carrier to a sensor carrier, which is connected to the measuring cell, can be provided on the main body of the circuit carrier.

In an advantageous embodiment of the sensor unit according to the disclosure, the vertically disposed circuit board may comprise a base carrier, which, on a first end face, has a first joining geometry, which can be joined to the outer joining geometry on the main body of the circuit carrier. Here, the base carrier of the substantially vertically disposed circuit board may have first contact means in the region of the first joining geometry, which first contact means form the internal electrical interface together with corresponding first contact means in the region of the outer joining geometry on the main body of the circuit carrier. The first joining geometry of the circuit board can be formed for example as a recess in the main body, which recess is delimited on two opposite sides in each case by a guide leg, wherein the two guide legs of the first joining geometry of the circuit board are each joined to a receiving pocket of the outer joining geometry of the circuit carrier. Here, the guide legs can be guided via inner guide edges into the receiving pockets and/or via outer guide edges along an inner contour of the protective sleeve. Due to a corresponding shaping of the receiving pockets in the circuit carrier, the circuit board may have a predefinable small angle of inclination relative to the vertical axis of the sensor unit, as necessary.

Exemplary embodiments of the disclosure are illustrated in the drawings and will be explained in greater detail in the following description. In the drawings, like reference signs denote components or elements that perform like or similar functions.

DETAILED DESCRIPTION

As can be seen from FIGS. 1 to 10, the illustrated exemplary embodiment of the sensor unit 1 according to the disclosure comprises a protective sleeve 20, in which at least one measuring cell 50, which in particular measures a hydraulic pressure of a fluid controlled by solenoid valve in a vehicle braking system, and a circuit carrier 60 according to the disclosure having a substantially vertically disposed circuit board 40 are arranged. The circuit board 40 can preferably be fitted with components on either side and comprises an electronic circuit 44 having at least one electronic and/or electrical component part 44.1, 44.2, which for example performs a signal amplification and/or a processing of a raw signal of the measuring cell 50. In the case of the illustrated exemplary embodiment, the electronic circuit 44 comprises an application-specific integrated circuit (ASIC) 44.1 and a corresponding protective circuit. The measuring cell 50 converts the hydraulic pressure into at least one electrical output signal and has at least one connection point 54, via which the at least one electrical output signal of the measuring cell 50 can be tapped. The circuit carrier 60 according to the disclosure has an internal interface 26, which taps the at least one electrical output signal of the measuring cell 50 and applies it to the electronic circuit 44. In addition, an output signal of the electronic circuit 44 can be tapped via an external interface 28. Here, the internal interface 26 is formed at a first end 20.1 of the protective sleeve 20, and the external interface 28 is formed at a second end 20.2 of the protective sleeve 20. The protective sleeve 20 protects the inner workings of the sensor unit 1 against excessive mechanical load.

To form the internal interface 26, the circuit carrier 60 according to the disclosure comprises a first interface 62a, via which at least one electrical output signal can be tapped at least at one connection point 54 of a measuring cell 50, and a second interface 62b, via which the at least one electrical output signal of the measuring cell 50 can be applied via first contact means 64.1 to the circuit board 40 with the electronic circuit 44. In accordance with the disclosure, the circuit carrier 60 comprises a main body 62 with an inner joining geometry 62.2, which is a mechanical part of the first interface 62a, and an outer joining geometry 62.1, which is a mechanical part of the second interface 62b. The main body 62 has at least one second contact means 64.3, which can be electrically connected in a force-free manner to a corresponding connection point 54 of the measuring cell 50.

Figures 1, 2:
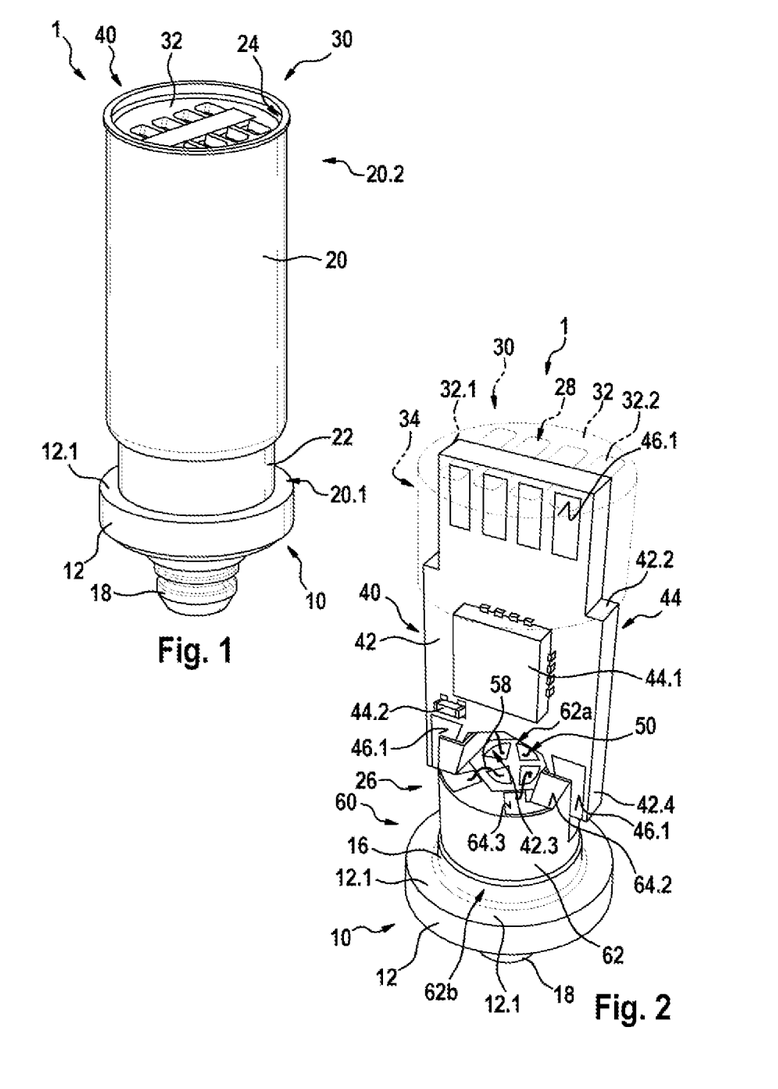
FIG. 1 shows a schematic perspective illustration of an embodiment of a sensor unit according to the disclosure with an exemplary embodiment of a circuit carrier according to the disclosure.
FIG. 2 shows a schematic perspective illustration of the sensor unit according to the disclosure from FIG. 1 without protective sleeve.

As is further evident from FIGS. 1 and 2, the protective sleeve 20 in the illustrated exemplary embodiment is formed as a hollow cylinder and at the first end 20.1 has a stepped portion 22. The protective sleeve 20 is joined at the stepped first end 20.1 to a sensor carrier 10, which has a fastening flange 12 and a measuring connection 18, which in the illustrated exemplary embodiment of the sensor unit 1 as a pressure sensor unit is formed as a self-clinch connection. The fastening flange 12 has a flange edge 12.1, on which the protective sleeve 20 is supported and via which the sensor unit 1 can be calked with a fluid block (not illustrated). In addition, the fastening flange 12 comprises a stepped flange surface 14, wherein the step 16 between the flange edge 12.1 and the flange surface 14 is used in the illustrated exemplary embodiment as a connection region, onto which the protective sleeve 20 is pressed. In addition, the protective sleeve 20 can be welded to the fastening flange 12 at the transition between the step 16 and the flange edge 12.1. The height of the stepped portion 22 or constriction of the protective sleeve 20 is selected such that the calking of the sensor unit 1 with the fluid block (not illustrated) is possible via the flange edge 12.1 by means of a calking tool. Due to the stepped embodiment at the lower first end 20.1 of the protective sleeve 20, the fastening flange 12 of the sensor carrier 10 can be formed advantageously with a smaller diameter. Alternatively, the protective sleeve 20 can also be formed, however, without a stepped portion 22.

As is further evident from FIGS. 2 to 10, the main body 62 of the circuit carrier 60 according to the disclosure in the illustrated exemplary embodiment is formed as a hollow cylinder with an inner joining geometry 62.2, which is formed as a polygon and is adapted to an outer contour 56 of the measuring cell 50 and surrounds the measuring cell 50 with play in the joined state. Due to the play provided between the measuring cell 50 and the circuit carrier 60, no force from the circuit carrier 60 can act on the measuring cell 50 during assembly and during operation, such that a negative influencing of the measurement behavior of the measuring cell 50 can be advantageously ruled out practically completely. Due to the embodiment as a polygon and the associated straight edges, the measuring cell 50 during the production can be cut out easily from a base plate. The outer contour 56 of the measuring cell 50 and thus the inner joining geometry 62.2 of the circuit carrier are preferably formed as a regular hexagon or octagon. The outer joining geometry 62.1 on the main body 62 of the circuit carrier 60 comprises two receiving pockets with protruding collars 62.3, which each comprise at least one first contact means 64.1 for electrically contacting the circuit board 40. The at least one first contact means 64.1 is connected via an external conductor track 64.2 on the main body 62 of the circuit carrier 60 to at least one second contact means 64.3 for electrically contacting the measuring cell 50. The first joining geometry 42.3 of the circuit board 40 is formed as a recess in the base carrier 42 and is delimited on two opposite sides in each case by a guide leg 42.4. The two guide legs 42.4 of the first joining geometry 42.3 of the circuit board 40 are each joined to a receiving pocket of the outer joining geometry 62.1 of the circuit carrier 60. In the illustrated exemplary embodiment, the two guide legs 42.4 of the circuit board 40 are guided via inner guide edges 42.5 into the receiving pockets 62.1 of the circuit carrier 60. Additionally or alternatively, the guide legs 42.4 of the circuit board 40 can also be guided via outer guide edges along an inner contour 24 of the protective sleeve 20. Due to an appropriate shaping of the receiving pockets 62.1, the circuit board 40 may have, as required, a predefinable small angle of inclination with respect to the perpendicular vertical axis of the sensor unit 1.

As is further evident from FIGS. 2 to 7, the base carrier 42 of the substantially vertically disposed circuit board 40, in the region of the first joining geometry 42.3, has first contact means 46.1, which form the internal electrical interface 26 together with corresponding first contact means 64.1 in the region of the outer joining geometry 62.1 on the main body 62 of the circuit carrier 60. In the region of the second joining geometry 42.1, the base carrier 42 of the vertically disposed circuit board 40 has second contact means 46.2, which can be contacted by corresponding external contact means 70 (illustrated in FIG. 10) and form the external electrical interface 28.

As is further evident from FIGS. 1 and 2, the main body 32 of the support unit 30 has a receiving opening 32.1 for the circuit board 40. The support unit 30 is introduced with play at the second end 20.2 of the protective sleeve 20 and is slid onto the circuit board 40 via the receiving opening 32.1. The support unit 30 supports the circuit board 40 against an inner contour 23 of the protective sleeve 20 via an outer contour 34. In addition, the support unit 30 has guide means 32.2, formed as contact receiving pockets, for guiding the external contact means 70.

Figures 3, 4:
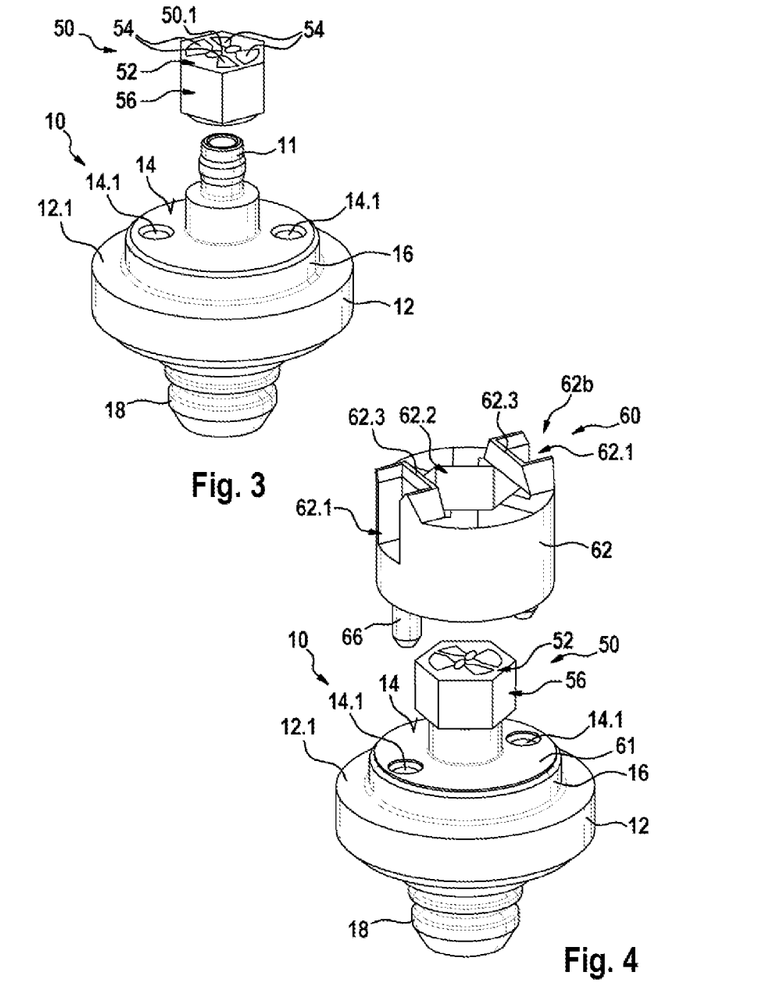
FIG. 3 shows a schematic perspective illustration of a sensor carrier with a fastening flange and a measuring cell for the sensor unit according to the disclosure from FIG. 1 or 2 prior to the joining of the measuring cell to the sensor carrier.
FIG. 4 shows a schematic perspective illustration of the sensor carrier and of the circuit carrier according to the disclosure for the sensor unit according to the disclosure from FIG. 1 or 2 prior to the joining of the circuit carrier according to the disclosure to the sensor carrier.
Figure 5:
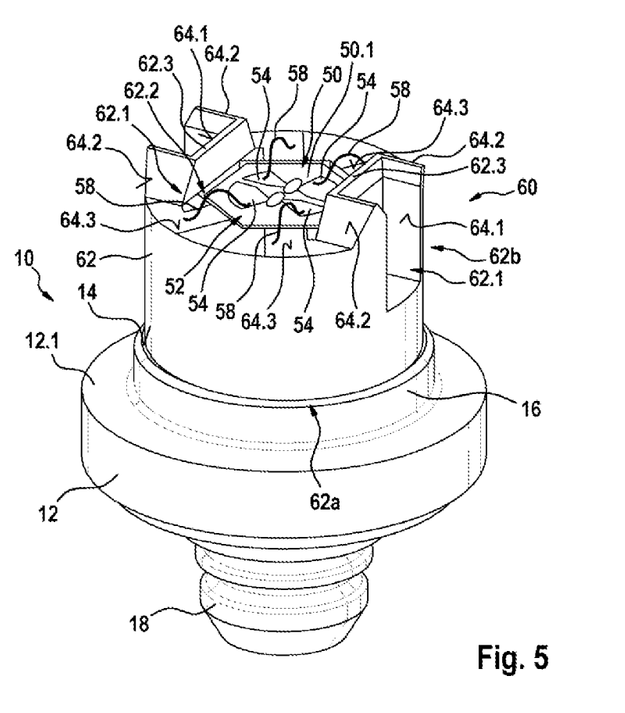
FIG. 5 shows a schematic perspective illustration of the sensor carrier with the joined circuit carrier according to the disclosure for the sensor unit according to the disclosure from FIG. 1 or 2.

As is further evident from FIGS. 3 to 5, the fastening flange 12 can be pressed together with or fastened to the fluid block (not illustrated), for example by means of a self-clinch connection 18. Besides the above-described connection region 16 for pressing or welding the protective sleeve 20, connection openings 14.1 are formed in the flange surface 14 and receive connection pins 66 arranged on the circuit carrier 60 in order to enable a connection between the circuit carrier 60 and the sensor carrier secured against twisting. To join the circuit carrier 60 to the sensor carrier 10, an adhesive layer 61 is applied to the flange surface 14 in the illustrated exemplary embodiment. Of course, other suitable connection techniques known to a person skilled in the art can also be used in order to join the circuit carrier 60 to the sensor carrier 10 in a manner secured against twisting. By way of example, a peripheral receiving groove can thus be formed on the fastening flange 12 of the sensor carrier 10, which groove, together with detent lugs or detent clips formed integrally on the main body 62 of the circuit carrier 60, can form a clip connection.

As is further evident from FIGS. 3 to 5, the measuring cell 50 formed in the illustrated exemplary embodiment as a pressure measuring cell is thus fitted on a tubular carrier 11 of the fastening flange 12, such that a measuring membrane 50.1 of the measuring cell 50 is deformed depending on the pressure of the fluid in the hydraulic block. The deformation of the measuring membrane 50.1 is measured by a measuring bridge 52. The measuring bridge 52 is connected to four contact points 54, which are each electrically connected via bonding wires 58 to the second contact means 64.3 of the circuit carrier 60 formed as bonding faces. The circuit carrier 60 is preferably formed using what is known as MID 2C technology. It is produced as an injection-molded circuit carrier 60 made of plastic using MID technology (molded interconnected device), in particular by means of two-component injection molding. By means of MID technology, three-dimensional circuit structures can be produced. A plastic preliminary injection-molded article made of a galvanizable first plastic is overmolded in part by a non-galvanizable second plastic. Alternatively, the non-galvanizable second plastic may also be overmolded at least in part with the galvanizable first plastic. The partially protruding surfaces of the preliminary injection-molded article are coated by means of a galvanic process with a metallic surface, such that the external conductor tracks 64.2 and the first and second contact means 64.1, 64.2 are produced. The circuit carrier 60 is characterized in particular by a high freedom of design, in particular due to the integration of electrical and mechanical functions. The sensor unit can thus be constructed in a particularly compact manner. In the illustrated exemplary embodiment, the circuit carrier 60 consists at least of a plastic preliminary injection-molded article made of a galvanizable first plastic and a non-galvanizable second plastic. The second contact means 64.3 formed as bonding faces are arranged on an end face of the circuit carrier 60 and are connected via external conductor tracks 64.2 to the corresponding first contact means 64.1, which are formed as contact faces and which are arranged in the receiving pockets of the outer joining geometry 62.1. The first contact means 64.1, the conductor tracks 64.2 and the second contact means 64.3 of the circuit carrier 60 are each formed as a metal layer with predefined dimensions and are applied in a galvanic process to the galvanizable plastic of the circuit carrier 60.

During the production of the sensor unit 1, the measuring cell 50 is welded to the sensor carrier 10. The circuit carrier 60 is then pressed into and adhesively bonded in the connection openings 14.1 via the connection pins 66, wherein the retaining adhesive layer 61 is introduced between the flange surface 14 and a base area of the circuit carrier 60. Following the curing of the retaining adhesive layer 61, the protective sleeve 20 is pressed on and possibly fixed by means of spot welding, as is evident from FIG. 6.

Figure 6:
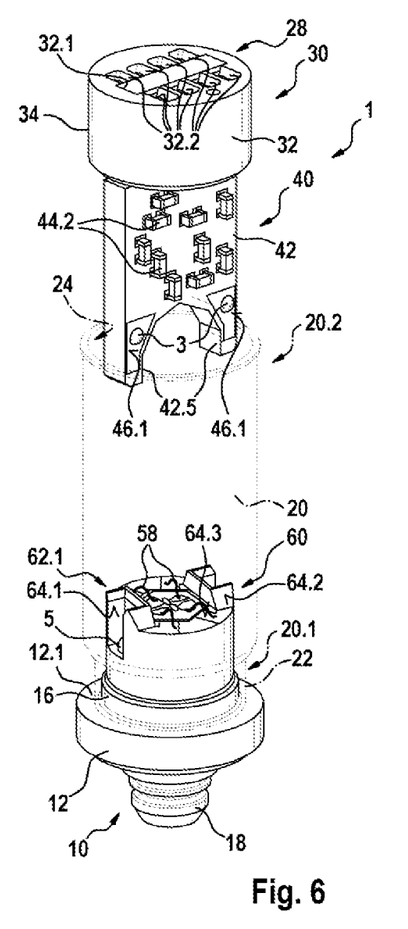
FIG. 6 shows a schematic perspective illustration of the sensor carrier with a joined protective sleeve prior to the joining of the circuit board, joined to a support unit, for the sensor unit according to the disclosure from FIG. 1 or 2.
Figure 7:
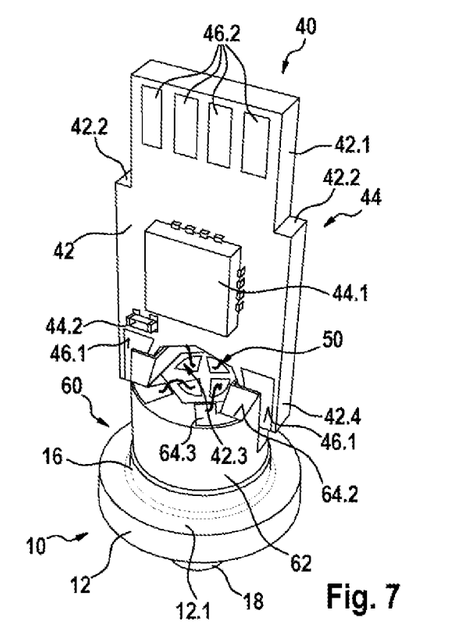
FIG. 7 shows a schematic perspective illustration of the sensor unit according to the disclosure from FIG. 1 or 2 after the joining of the circuit board without support unit and without protective sleeve.
Figure 8:
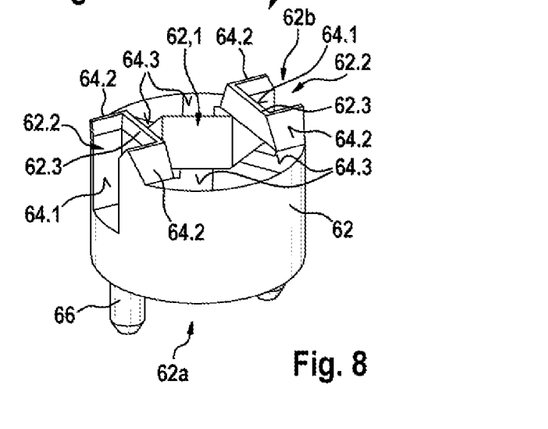
FIG. 8 shows a schematic perspective illustration of the circuit carrier according to the disclosure for the sensor unit according to the disclosure.
Figure 9:
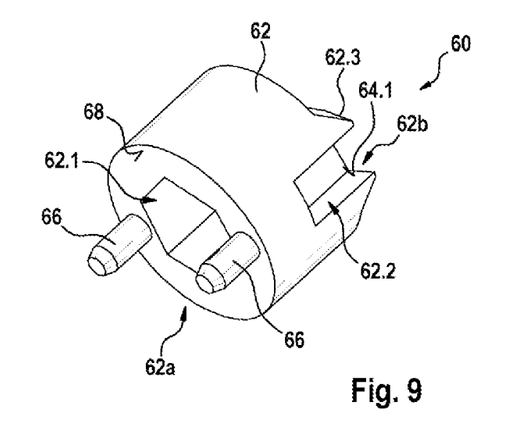
FIG. 9 shows another schematic perspective illustration of the circuit carrier according to the disclosure for the sensor unit according to the disclosure.
Figure 10:
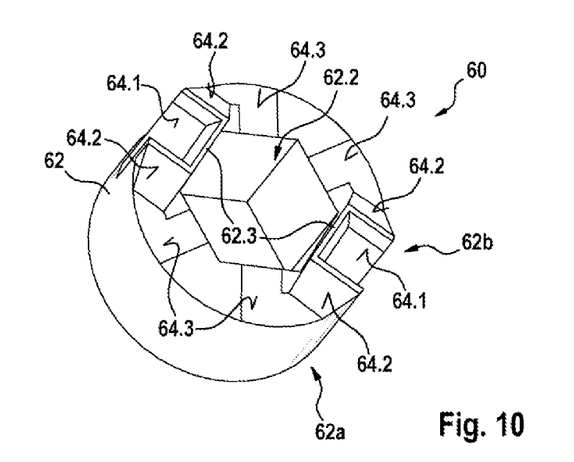
FIG. 10 shows another schematic perspective illustration of the circuit carrier according to the disclosure for the sensor unit according to the disclosure2.

As is further evident from FIGS. 6 and 7, the circuit board 40 is inserted into the receiving pockets of the outer joining geometry 62.1 on the main body 62 of the circuit carrier 60 and where applicable is fixed there with retaining adhesive 5 and conductive adhesive 3 in order to ensure an electrically conductive connection between the circuit carrier 60 and the circuit board 40 and in order to fix the circuit board 40. As is further evident from FIG. 6, the retaining adhesive 5 is introduced on base areas of the receiving pockets 62.1 of the circuit carrier 60, and the conductive adhesive 3 is applied to the first contact means 46.1 of the circuit board 40, said contact means being formed as contact faces. Alternatively, the first contact means 64.1 on the main body 62 of the circuit carrier are formed as resilient contact elements, which exert a force, perpendicular to the direction of insertion of the circuit board 40, onto the first contact means 46.1 of the circuit board 40 formed as contact faces and simultaneously fix the circuit board 40 inserted into the receiving pockets of the outer joining geometry 62.1, such that it is possible to dispense with the retaining adhesive 5 and the conductive adhesive 3.

The support unit 30 can be fitted onto the circuit board 40 prior to or after the joining of the circuit board 40. In addition, a mechanical and/or electrical connection between the circuit board 40 and the support unit 30 can be produced where appropriate by means of conductive and/or retaining adhesive. In order to ensure a reliable electrical and mechanical connection between the circuit board 40 and the circuit carrier 60 at the internal interface 26, the support unit 30 can be fitted prior to the curing of the conductive and/or retaining adhesive at the internal interface 26 in order to ensure, by means of the support of the circuit board 40 on the inner contour 24 of the protective sleeve 20, a force-free or stress-free curing of the conductive adhesive 3 and of the retaining adhesive 5 at the internal interface 26.

As is further evident from FIGS. 2, 6 and 7, the circuit board 40 comprises the planar base carrier 42 with first contact means 46.1 formed as contact faces and second contact means 46.2 formed as redundant contact faces, which are arranged on both sides of the base carrier 42. As is further evident from FIGS. 2, 6 and 7, the base carrier 42 of the circuit board 40 is narrower in the region of the external interface 28 in order to form the second joining geometry 42.1 with a first guide edge and has a stop shoulder 42.2, against which the support unit 30 rests when the second end face of the circuit board 40 is received by the receiving opening 32.1 of the support unit 30 in order to guide the support unit 30 and to fix it on the circuit board 40. Alternatively, the stop can also be formed in the upper region of the support unit 30 by delimiting the depth of the receiving opening 32.1 in the support unit 30 for receiving the second joining geometry 42.1 of the circuit board 40.

As is further evident from FIGS. 2, 6 and 7, the base carrier 42 of the circuit board 40, in the region of the internal interface 26 for forming the first joining geometry 42.3, has a fork shape with the two guide legs 42.4 and two second guide edges 42.5, which delimit a recess. As already mentioned above, the guide legs 42.4 of the circuit board 40 may additionally or alternatively also be guided via outer guide edges along the inner contour 24 of the protective sleeve 20. The fork shape of the first joining geometry 42.3 of the circuit board 40 is matched to the receiving pockets of the outer guide geometry 62.1 of the circuit carrier 60, such that the base carrier 42 of the circuit board 40 can be inserted into and fixed in the circuit carrier 60. The circuit board 40 is fitted with components on both sides in the illustrated exemplary embodiment and has at least two layers. The second contact means 46.2 of the circuit board 40 are formed in the illustrated exemplary embodiment as redundant contact faces, which are arranged on an upper side and an underside respectively of the base carrier 42 of the circuit board 40. The second contact means 46.2 can be contacted via external contact means 70, which for example are formed as contact clips having two legs, which can be slid onto the second contact means formed as redundant contact faces, such that a contact force acts perpendicularly to the direction of insertion of the base carrier 42 of the circuit board 40. Since the contact force is thus applied transversely to the inserted circuit board, the rest of the circuit board 40, in particular the internal interface, can remain free from force. In addition, as a result of this geometry, a greater contact force is possible, such that it is possible advantageously to dispense with costly contact materials, such as gold.

The described circuit carrier according to the disclosure is particularly suitable for use in a pressure sensor unit for braking systems of motor vehicles, but is not limited hereto. The circuit carrier according to the disclosure may thus also be used, by way of example, for optical and/or acoustic measuring cells. In particular in the case of premium-class braking systems, a multiplicity of pressure sensors are used with only limited installation space. A pressure sensor unit having minimized installation space is therefore suitable especially for this application.

The invention claimed is:

1. A circuit carrier for a sensor unit comprising:
   a first interface via which at least one electrical output signal is tapped at least at one connection point of a measuring cell;
   a second interface via which the at least one electrical output signal of the measuring cell is applied via at least one first contact element to a circuit board with an electronic circuit;
   a hollow, cylindrical main body including: (i) an inner axially extending contour (ii) an inner joining geometry defined on the inner axially extending contour; (iii) an outer joining geometry which defines at least in part a mechanical part of the second interface; and (iv) at least one second contact element configured to be electrically connected in a force-free manner to a corresponding connection point of the measuring cell, the at least one second contact element a part of the first interface,
   wherein the inner joining geometry defines at least in part a mechanical part of the first interface; and
   wherein the outer joining geometry is configured as a receiving pocket with a protruding collar, and includes the at least one first contact element within the receiving pocket; and
   wherein the at least one first contact element is electrically connected to at least one corresponding second contact element via the conductor track positioned externally on the main body.

2. The circuit carrier as claimed in claim 1, wherein the inner joining geometry is shaped complementary to an outer contour of the measuring cell.

3. The circuit carrier as claimed in claim 1, wherein the inner joining geometry is shaped as a polygon.

4. The circuit carrier as claimed in claim 1, further comprising a joining element positioned on the main body and configured to join the circuit carrier to a sensor carrier that is connected to the measuring cell.

5. The circuit carrier as claimed in claim 1, wherein the receiving pocket is a radially opening and axially opening receiving pocket.

6. A sensor unit comprising:
   a protective sleeve defining a first end and a second end;

at least one measuring cell configured to measure a pressure of a hydraulic block and including at least one connection point via which at least one electrical output signal of the measuring cell is tapped;

an electronic circuit including at least one of an electronic and electrical component part;

a circuit carrier including a hollow, cylindrical main body including: (i) an inner axially extending contour, (ii) an inner joining geometry defined on the inner axially extending contour and defining at least in part a mechanical part of a first interface; (iii) an outer joining geometry configured as a receiving pocket with a protruding collar and including at least one first contact element within the receiving pocket that defines at least in part a second interface via which the at least one electrical output signal of the at least one measuring cell is applied via the at least one first contact element to a circuit board; and (iv) at least one second contact element configured to be electrically connected in a force-free manner to a corresponding connection point of the at least one measuring cell, the at least one second contact element a part of the first interface via which at least one electrical output signal is tapped at the at least one connection point of the at least one measuring cell; and a vertically disposed circuit board, wherein the at least one measuring cell, the circuit carrier and the circuit board are positioned in the protective sleeve; and wherein the first interface is positioned at the first end of the protective sleeve and an external interface of the electronic circuit is positioned at the second end of the protective sleeve.

7. The sensor unit as claimed in claim 6, wherein the inner joining geometry of the main body of the circuit carrier is shaped complementary to an outer contour of the at least one measuring cell with the main body surrounding the at least one measuring cell.

8. The sensor unit as claimed in claim 6, wherein the at least one second contact element of the circuit carrier is electrically connected via a bonding wire to a corresponding connection point of the at least one measuring cell.

9. The sensor unit as claimed in claim 6, wherein:
the vertically disposed circuit board includes a base carrier defining a first end face;
the base carrier having: (i) a first joining geometry on the first end face joined to the outer joining geometry of the main body of the circuit carrier; and (ii) a first contact element in a region of the first joining geometry that defines the first interface together with a corresponding first contact element in a region of the outer joining geometry on the main body of the circuit carrier.

10. The sensor unit as claimed in claim 9, wherein:
the first joining geometry is configured as a recess in the base carrier delimited on a first side of the first joining geometry by a first guide leg, and on an opposite second side of the first joining geometry by a second guide leg; and
the two guide legs are each joined to the receiving pocket of the outer joining geometry.

11. The sensor unit as claimed in claim 6, wherein the receiving pocket is a radially opening and axially opening receiving pocket.

* * * * *

UNITED STATES PATENT AND TRADEMARK OFFICE
CERTIFICATE OF CORRECTION

Page 1 of 1

PATENT NO. : 9,638,599 B2
APPLICATION NO. : 14/388492
DATED : May 2, 2017
INVENTOR(S) : Schlitzkus et al.

It is certified that error appears in the above-identified patent and that said Letters Patent is hereby corrected as shown below:

In the Claims

In Column 10, Lines 35-37, Lines 9-11 of Claim 1 should read:

a hollow, cylindrical main body including: (i) an inner
    axially extending contour; (ii) an inner joining geometry
    defined on the inner axially extending contour; (iii) an Signed and Sealed this
First Day of August, 2017

Joseph Matal
*Performing the Functions and Duties of the*
*Under Secretary of Commerce for Intellectual Property and*
*Director of the United States Patent and Trademark Office*